United States Patent
Khoo et al.

(10) Patent No.: US 7,735,035 B1
(45) Date of Patent: Jun. 8, 2010

(54) METHOD AND SYSTEM FOR CREATING A BOOLEAN MODEL OF MULTI-PATH AND MULTI-STRENGTH SIGNALS FOR VERIFICATION

(75) Inventors: Kei-Yong Khoo, San Jose, CA (US); Mitchell Hines, San Jose, CA (US); Chih-Chang Lin, Saratoga, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 563 days.

(21) Appl. No.: 11/444,971

(22) Filed: May 31, 2006

Related U.S. Application Data

(60) Provisional application No. 60/686,756, filed on Jun. 1, 2005.

(51) Int. Cl.
*G06F 9/45* (2006.01)
*G06F 17/50* (2006.01)

(52) U.S. Cl. .................. 716/5; 716/3; 716/4; 703/13
(58) Field of Classification Search .............. 716/3, 716/4–6; 703/13–15
See application file for complete search history.

(56) References Cited

U.S. PATENT DOCUMENTS

| | | | |
|---|---|---|---|
| 5,519,627 A | 5/1996 | Mahmood et al. | |
| 5,764,525 A | 6/1998 | Mahmood et al. | |
| 5,841,663 A | 11/1998 | Sharma et al. | |
| 5,931,963 A | 8/1999 | Tani | |
| 6,148,436 A | 11/2000 | Wohl | |
| 6,163,876 A | 12/2000 | Ashar et al. | |
| 6,247,165 B1 * | 6/2001 | Wohl et al. ................. 716/5 |
| 6,336,206 B1 | 1/2002 | Lockyear | |
| 6,378,112 B1 | 4/2002 | Martin et al. | |
| 6,457,173 B1 | 9/2002 | Gupta et al. | |
| 6,490,717 B1 | 12/2002 | Pedersen et al. | |
| 6,530,073 B2 | 3/2003 | Morgan | |
| 6,598,215 B2 | 7/2003 | Das et al. | |
| 6,604,065 B1 * | 8/2003 | Blomgren et al. ........... 703/15 |
| 6,611,947 B1 | 8/2003 | Higgins et al. | |
| 6,738,392 B1 | 5/2004 | Thurston | |
| 6,742,174 B1 | 5/2004 | Chen et al. | |
| 6,975,976 B1 * | 12/2005 | Casavant et al. ........... 703/14 |
| 6,999,910 B2 | 2/2006 | Koford et al. | |

(Continued)

OTHER PUBLICATIONS

Brand, D. "Verification of Large Synthesized Designs" Proceedings of the 1993 IEEE/ACM International Conference on Computer-Aided Design (ICCAD-93), Digest of Technical Papers, Santa Clara, California, Nov. 7-11, 1993, pp. 534-537.

(Continued)

*Primary Examiner*—Paul Dinh
*Assistant Examiner*—Nha T Nguyen
(74) *Attorney, Agent, or Firm*—Vista IP Law Group LLP

(57) ABSTRACT

A system, method, computer program product for verification and equivalence checking. In one approach, the system, method, and computer program product analyzes the switching paths in a manner consistent with circuit functionality to provide a complete application which can verify the complex characteristics in the circuits to the accurate RTL model function, including FPGA, ROM Arrays, RAM circuits, and other custom integrated circuit designs.

23 Claims, 7 Drawing Sheets

U.S. PATENT DOCUMENTS 7,193,437 B2 *   3/2007   Cappelli et al. .............. 326/41
2004/0078179 A1   4/2004   Fuji et al.

OTHER PUBLICATIONS

Burch, J.R. et al. "Symbolic Model Checking for Sequential Circuit Verification" IEEE Transactions on Computer-Aided Design of Integrated Circuits and Systems, Apr. 1994, vol. 13, No. 4, pp. 401-424.

Kuehlmann, A. et al. "Equivalence Checking Using Cuts and Heaps" Proceedings of the 34th Annual ACM/IEEE Design Automation Conference (DAC 97), Anaheim, California, Jun. 9-13, 1997, pp. 263-268.

Pawlovsky, A.P. et al. "Verification of Register Transfer Level (RTL) Designs" Proceedings of the Pacific Rim International Symposium on Fault Tolerant Systems (PRFTS '91), Kawasaki, Japan, Sep. 26-27, 1991, pp. 30-35.

Stoffel, D. et al. "Logic Equivalence Checking by Optimization Techniques" Proceedings of the International Workshop on CAD, Test and Evaluation of Dependability, Beijing, China, Jul. 2-3, 1996, pp. 85-90.

Vakilotojar, V. et al. "RTL Verification of Timed Asynchronous and Heterogeneous Systems Using Symbolic Model Checking" Proceedings of the ASP-DAC '97: Asia and South Pacific Design Automation Conference, Chiba City, Japan, Jan. 28-31, 1997, pp. 181-188.

U.S. Appl. No. 11/271,269, filed Nov. 10, 2005.

Office Action dated Sep. 7, 2007 for U.S. Appl. No. 11/271,269.

Non-Final Office Action dated Feb. 1, 2010 for U.S. Appl. No. 12/260,353.

* cited by examiner

――― WEAK 0

――― WEAK 1

――― STRONG 0

――― STRONG 1

――― ENABLE

――― MULTIPATH

Fig 4A $\dfrac{0}{\rule{2em}{0.4pt}}$ WEAK 0

$\dfrac{0}{\rule{2em}{0.4pt}}$ WEAK 1

$\dfrac{0}{\rule{2em}{0.4pt}}$ STRONG 0

$\dfrac{1}{\rule{2em}{0.4pt}}$ STRONG 1

$\dfrac{0}{\rule{2em}{0.4pt}}$ ENABLE $\dfrac{0}{\rule{2em}{0.4pt}}$ MULTIPATH

METHOD AND SYSTEM FOR CREATING A BOOLEAN MODEL OF MULTI-PATH AND MULTI-STRENGTH SIGNALS FOR VERIFICATION

CROSS-REFERENCE TO RELATED APPLICATIONS

The present application claims the benefit of U.S. Provisional application Ser. No. 60/686,756 filed on Jun. 1, 2005, which is hereby incorporated by reference in its entirety.

BACKGROUND AND SUMMARY

This disclosure is generally directed to the area of verification for integrated circuit (IC) designs. In particular, the disclosure is related to an improved approach for implementing equivalence checking functionality in electronic design automation (EDA) verification tools.

Today, ICs typically contain large numbers of circuit elements. Computer-aided design (CAD) and computer-aided engineering (CAE) tools are essential in assisting circuit designers to produce these complicated ICs. Circuit designs are typically represented in a user-specified hardware description language (HDL), which demonstrate the behavioral properties of the circuit.

Designers commonly utilize CAE software, or synthesis, to translate the behavioral representation, for example, a Register-Transfer-Level (RTL) description, into a implementation representation, for example, a gate-level representation. The synthesizer makes choices on the implementation architecture based on parameters such as timing, footprint, and power consumption. The result of the synthesis process, the gate-level representation, is referred to as the revised circuit, while the behavioral properties of the circuit, the RTL representation, is referred to as the golden circuit.

With increasing design complexity, formal verification (and particularly equivalence checking) becomes integral in the design process to ensure that the revised circuit is equivalent to the original specification, or golden circuit. In the verification of digital circuits, signals in the circuits are "compared" in some manner in order to draw a conclusion on the "correctness" of one or more properties of the circuits. For example, to determine if two circuits with identical state encoding will behave identically under some excitations, one can simply compare the simulated values of the corresponding state-points in the two circuits when the circuits are subjected to the same excitations.

In addition, one can show that the two circuits will behave identically under all possible excitations with a formal methodology wherein the functions of the corresponding state-points in the two circuits are proved to be functionally equivalent. This method is known as formal equivalence checking and it is in the category of verification methods known as formal verification.

Alternatively, simulation refers to the process of simulating only some of the possible excitations on the two circuits to determine that they behave equivalently. However, as all the possible excitations are not tested, this technique can lead to errors in practice. Simulation is considered an informal verification technique.

Conventionally, simulation, although inferior to formal verification, is used to test those circuits that can not be tested using formal techniques. For example, formal techniques cannot be used on circuits with multiple levels of input to output paths. Some example circuits with multiple input and output paths include FPGA, ROM arrays, RAM circuits, and other custom integrated circuit designs.

A typical approach to test multiple levels of input to output paths is to abstract out all the transistors and model them as Boolean functions. However, Boolean functions are incapable of accurately representing all the possible switch situations. Thus, the Boolean model eliminates the ability to natively view and analyze the circuits as they truly function. Verification techniques using these Boolean abstractions are inaccurate and therefore leave potential problems undetected in the finished circuit design.

Therefore, a method to verify a circuit that contain multiple levels of input/output paths is needed. Some embodiments of the invention provide an improved method and system for verification. In some embodiments, a method and system of creating a boolean model of multi-path and multi-strength signals for verification includes: reading a design description of the circuit design, replacing each multi-strength device with logic including encoded output signals, inserting logic into the encoded output signals, applying a Boolean algorithm.

BRIEF DESCRIPTION OF THE DRAWINGS

FIGS. 4A and 4B are representations of the encoding process.

DETAILED DESCRIPTION OF INVENTION

Traditional equivalence checking techniques ignore the complex characteristics of circuits such as FPGA, ROM Arrays, RAM circuits, and other custom integrated circuit designs. These characteristics include: multi-strength signals, multi-path networks, switch circuits, and signal resolution. This new solution analyzes the switching paths in a manner consistent with circuit functionality to provide a complete application which can verify the complex characteristics in the circuits to the accurate RTL model function.

This disclosure will first discuss the complex characteristics, then describe the solution for verifying them.

Characteristics

Switch Circuits

Switch Circuits refers to the notion that there are elements interconnected in a circuit that need to be verified. The interconnectedness of these elements creates a challenge in that the value of the resulting signal is not immediately apparent. For example, active devices such as gates have an output signal strength that is not dependent on the input signal, as gates have their own power supply. Conversely, passive devices, such as switches have an output strength that is dependent on the input signal strength. In addition, the output of a switch circuit can be any one of multiple strengths.

Multi-Strength

Figure 1A:
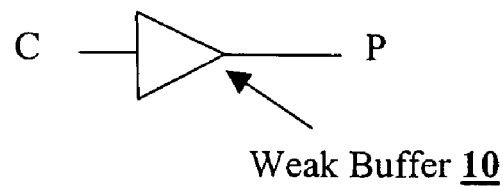
FIGS. 1A-1B are representations of circuits and differing signal strength.

In traditional Boolean models signal strength is either on or off. However, this is not an accurate representation of reality. In reality some switches can be partially on, fully on, and strongly on. For example, a buffer gate 10 in FIG. 1A can be designated as a "WEAK" buffer to indicate that its output strength is weaker than normal. FIG. 1A shows, the signal P driven by the buffer 10, the signal P is therefore weak. Notice that in this example, the signal strength generated by the buffer is always "WEAK" regardless of the signal strength of input C.

Figure 1B:
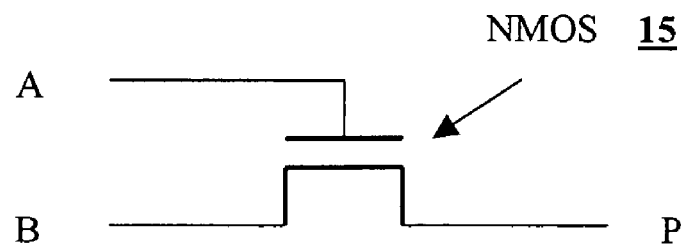

Another example of a device capable of processing and generating signals of different strengths is an NMOS device shown in FIG. 1B. The NMOS 15 is a switch device that passes its input signal to the output. In FIG. 1B, when the terminal A is driven HIGH, then the signal at the terminal B is passed to the output of the NMOS 15, terminal P. This scenario is referred to as the enabled mode of the NMOS 15. The signal strength at terminal P depends on the strength of the signal at B. If the signal strength at B is strong, then the signal strength at P will also be strong when the NMOS is enabled. Similarly, if the signal strength at B is weak, then the signal strength at P will also be weak when the NMOS is enabled.

The strength at the output of a switch device can also be different from its input. For example, a resistive NMOS operates in a fashion similar to NMOS, except that its output signal is weaker than its input signal, a processing called strength reduction.

Multipath

Multipath refers to the process of determining error conditions for a circuit network. There are two ways in which multiple path networks can be in an error condition. First, there may be an actual collision of signals. Second, there may be a network that has two switches in the open position when certain inputs are applied. The latter scenario does not necessarily indicate a collision, but it has the potential to result in a collision. Designers usually prefer to check for errors conservatively. That is, not just collisions are flagged as errors, but all potential collisions (i.e., two switches open simultaneously) are flagged as errors as well. Traditional techniques do not allow this conservative approach in a Boolean model for equivalence checking. The solution herein allows signal encoding such that the boolean circuit is modeled more closely after the "conservative" or "pessimistic" RTL circuit and flags potential collisions.

Signal Resolution

Signal resolution is the process in which the logic value of a signal is determined when a network is driven by more than one gate or at least one switch. In contemporary systems, the logic value of the signal is programmed based solely on the strength of the signals. However, this is an inaccurate representation of the circuit. For example, consider the circuit shown in FIG. 1C.

Figure 1C:
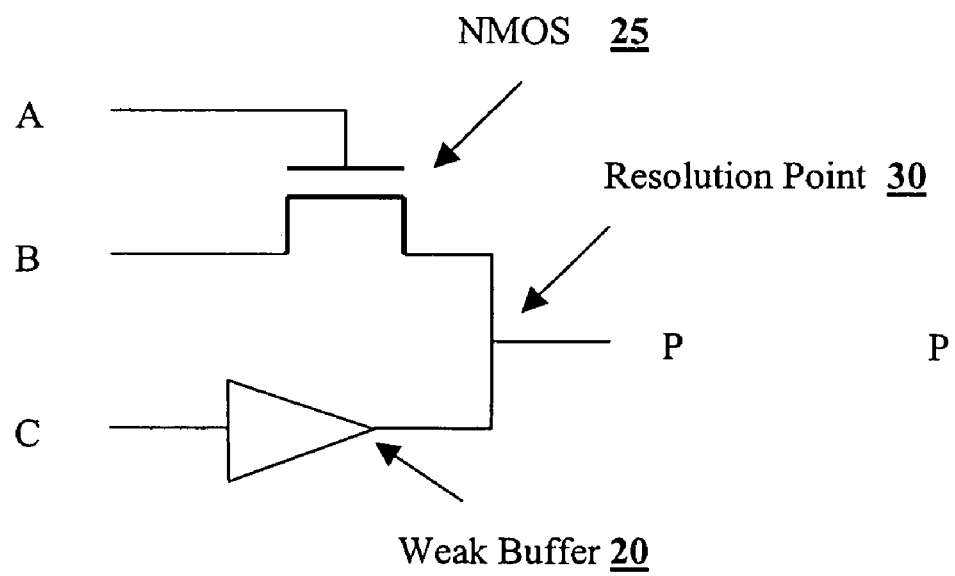
FIG. 1C is a representation of a signal resolution example

The output of devices with multiple strength in a circuit is called the resolution point. FIG. 1C includes resolution point 30 and shows the connection of a weak buffer 20 with an NMOS 25. Because wires are electrically conductive, the output signal of the NMOS is resolved with the output signal of the buffer. Therefore, even though there are two devices in the circuit, there is only one unique output signal P for both devices. In actual operation, the circuit will behave as follows.

If terminal A is driven LOW, NMOS 25 is disabled, then the signal at P will consist only of signals from the buffer 20 and it will be of a weak strength.

If NMOS 25 is enable and the signal at B is of a strong strength, then the signal at P will also be strong. Furthermore, the logic level at P will only depend on signal B because the strong signal overrides the weaker signal. This process of selection of signals of a particular strength (in this example, signals of strong strength) is called strength resolution.

In the case of the signal at B being weak (equal strength with the buffer 20), then the logic level at P will depend on the wire-resolution mode specified by the user. The wire-resolution mode determines how signal of equal strength can resolve to a value.

Even though the circuit above can be described using design description languages (such as Verilog), some algorithms cannot directly operate on such a circuit. For example, equivalence checking usually involves operation on circuits with binary logic values only. This solution presents an encoding technique that accurately models the circuit so that algorithms operating on binary logic circuit without strength can also be applied to the circuits shown in FIGS. 1A-1C.

Figure 2:
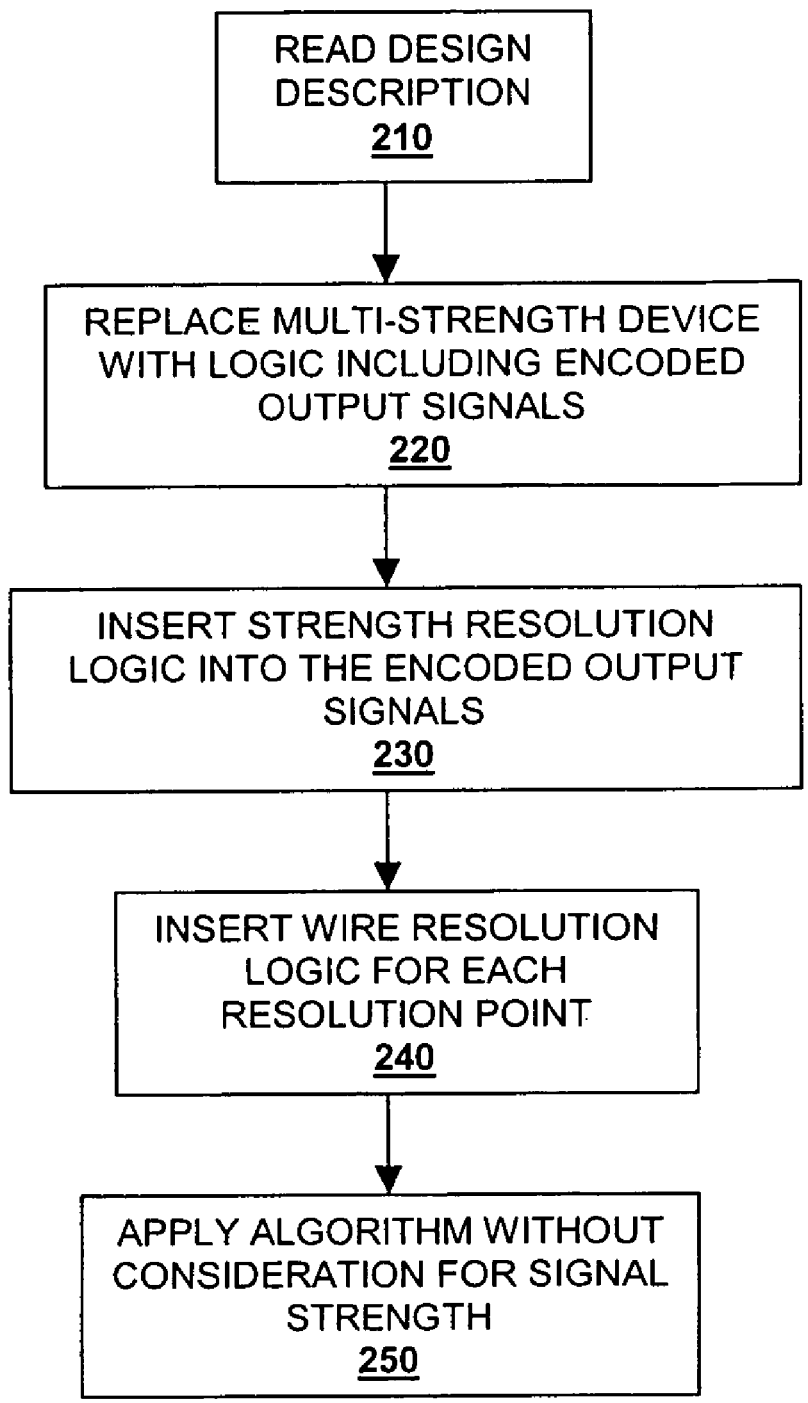
FIG. 2 is a representation of an overview of creating a boolean model of multi-path and multi-strength signals for verification.

And overview of creating a boolean model of multi-path and multi-strength signals for verification is shown in FIG. 2. The design description is read in process action 210. Any multistrength devices are replaced with logic which includes encoded output signals in process action 220. The strength resolution logic is inserted into the encoded output signals in process action 230. The wire resolution logic for each resolution point is inserted into the encoded output signals in process action 240. The Boolean algorithm is applied to the encoded circuit in process action 250.

Encoding

Figure 3:
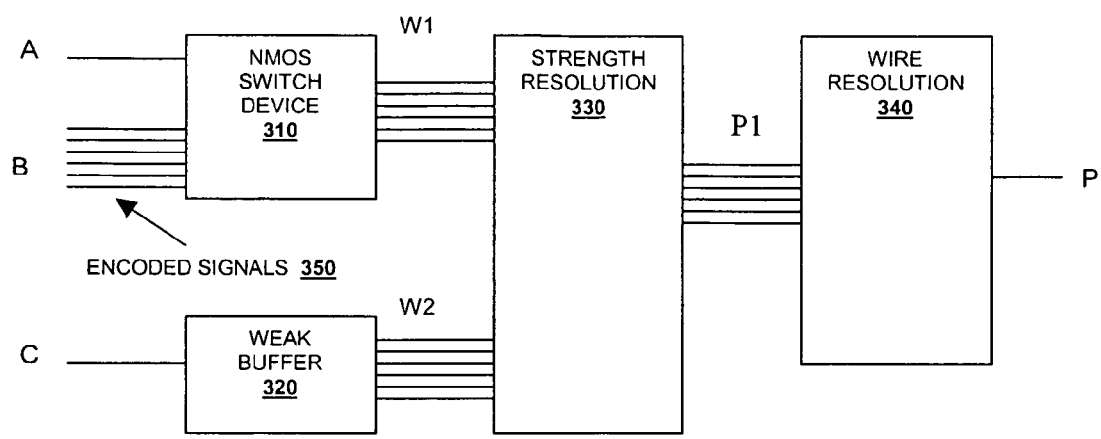
FIG. 3 is a representation of an encoded circuit.

Encoding is the process of modeling the multi-strength signals such that a Boolean algorithm can evaluate them. An example of applying the encoding to the example circuit IC is shown in FIG. 3. Note that the circuit contains only Boolean logic gates and therefore can be processed by algorithms that do not consider strength.

Notice that output P in FIG. 3 is the regular Boolean signal. However, if the terminal P in the original circuit is connected to a switch device, then the encoded signals P1 is used to drive that logic. For example, notice that terminal B, the input to the NMOS switch device 310, is shown as capable of receiving an encoded signal. Each of the outputs W1 and W2 are encoded signals. W1 is the output of the NMOS device 310 and W2 is the output of the buffer 320. W1 and W2 are input into strength resolution logic 330. The output of strength resolution 330, P1, is also encoded as it is input into wire resolution 340.

An example of encoding an output signal with strengths is shown in FIGS. 4A and 4B. In this example, suppose that there are only two strengths. The strength values are encoded using individual signals (in this example, six signals are used). The ENABLE and MULTIPATH signals are optional signals used to model multiple activation paths. Notice that six signals are used in FIG. 4A for ease of discussion. However, it is possible to use fewer number of signals while retaining the functionality of the encoding.

A signal is HIGH if there is, a component of that particular strength. For example, the logic settings of the encoded signal of FIG. 4B represent a STRONG logic 1. Note the 1 in the "Strong 1" input.

Figure 5:
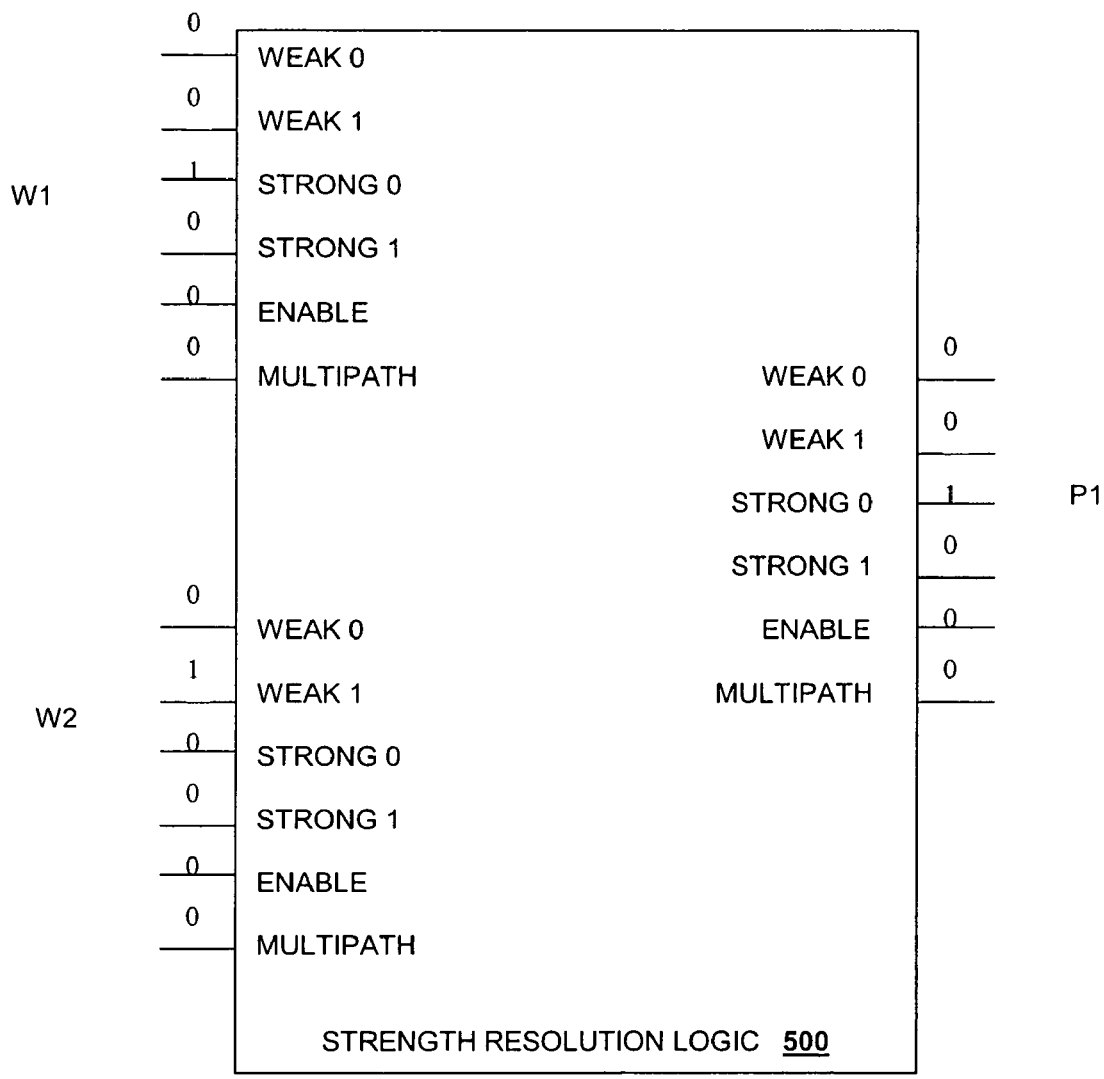
FIG. 5 is a representation of strength resolution logic.

In the strength resolution logic 500 shown in FIG. 5, the encoded signals (excluding ENABLE and MULTIPATH) are ORed but with all weaker signals eliminated. For example, in FIG. 5, the weak 1 signal of W2 is eliminated because of the presence of the strong 0 signal of W1. The output ENABLE signal is the OR of all input ENABLE signals. And the output MULTIPATH signal is TRUE if any of the input MULTIPATH signals is true OR if more than one ENABLE signal is active.

Figure 6:
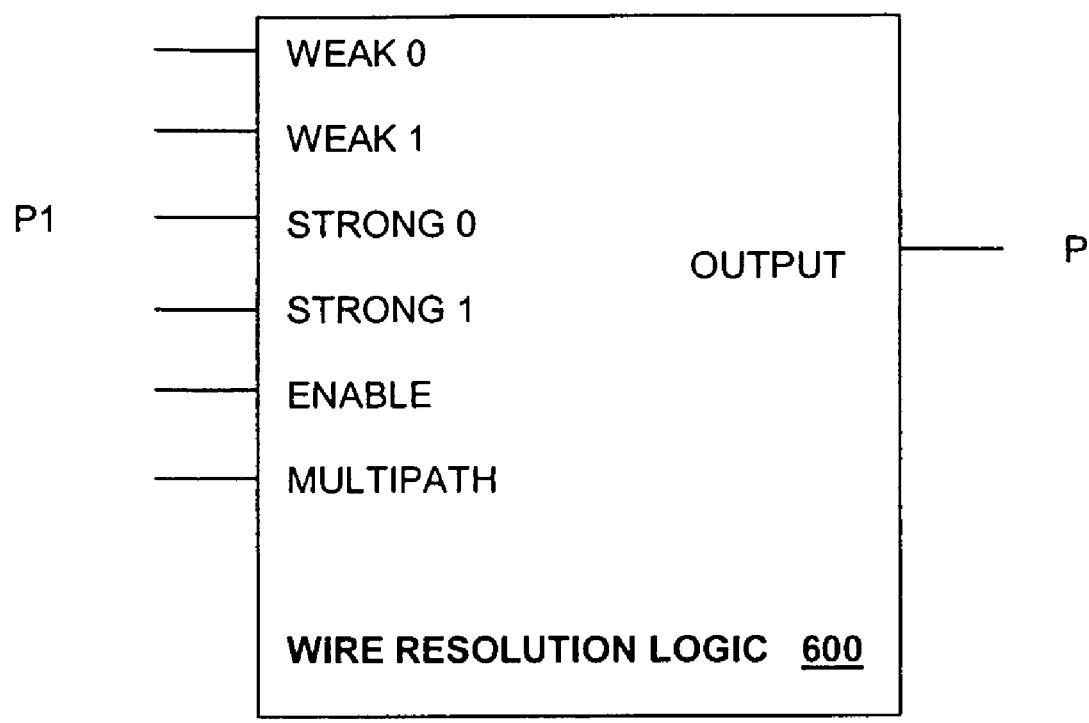
FIG. 6 is a representation of wire resolution logic.

After the strength resolution logic, the encoded signals can be used directly to drive another switch level gate. However, if the signal is used to drive a boolean gate, then it is passed through a wire-resolution block 600 shown in FIG. 6. The wire-resolution block will implement the wire-AND or wire-OR function according to the user's specification to generate the OUTPUT signal P. The MULTIPATH signal at P1 can be used to indicate an error condition for equivalence checking.

System Architecture Overview

Figure 7:
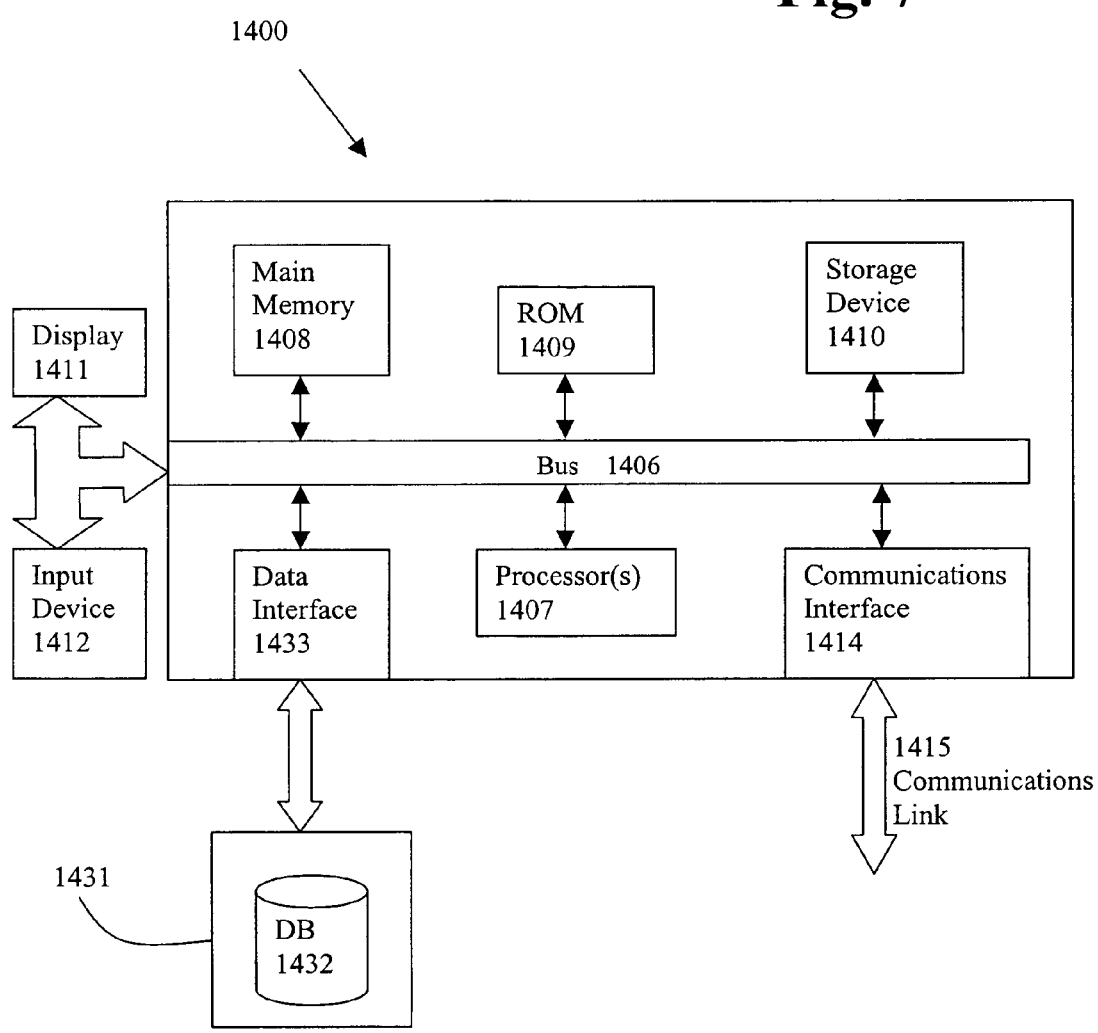
FIG. 7 is a representation of a system 1400 to enact circuit encoding for equivalence checking.

The execution of the sequences of instructions required to practice the invention may be performed in embodiments of the invention by a computer system 1400 as shown in FIG. 7. In an embodiment of the invention, execution of the sequences of instructions required to practice the invention is performed by a single computer system 1400. According to other embodiments of the invention, two or more computer systems 1400 coupled by a communication link 1415 may perform the sequence of instructions required to practice the invention in coordination with one another. In order to avoid needlessly obscuring the invention, a description of only one computer system 1400 will be presented below; however, it should be understood that any number of computer systems 1400 may be employed to practice the invention.

A computer system 1400 according to an embodiment of the invention will now be described with reference to FIG. 7, which is a block diagram of the functional components of a computer system 1400 according to an embodiment of the invention. As used herein, the term computer system 1400 is broadly used to describe any computing device that can store and independently run one or more programs.

Each computer system 1400 may include a communication interface 1414 coupled to the bus 1406. The communication interface 1414 provides two-way communication between computer systems 1400. The communication interface 1414 of a respective computer system 1400 transmits and receives electrical, electromagnetic or optical signals, that include data streams representing various types of signal information, e.g., instructions, messages and data. A communication link 1415 links one computer system 1400 with another computer system 1400. For example, the communication link 1415 may be a LAN, in which case the communication interface 1414 may be a LAN card, or the communication link 1415 may be a PSTN, in which case the communication interface 1414 may be an integrated services digital network (ISDN) card or a modem.

A computer system 1400 may transmit and receive messages, data, and instructions, including program, i.e., application, code, through its respective communication link 1415 and communication interface 1414. Received program code may be executed by the respective processor(s) 1407 as it is received, and/or stored in the storage device 1410, or other associated non-volatile media, for later execution.

In an embodiment, the computer system 1400 operates in conjunction with a data storage system 1431, e.g., a data storage system 1431 that contains a database 1432 that is readily accessible by the computer system 1400. The computer system 1400 communicates with the data storage system 1431 through a data interface 1433. A data interface 1433, which is coupled to the bus 1406, transmits and receives electrical, electromagnetic or optical signals, that include data streams representing various types of signal information, e.g., instructions, messages and data. In embodiments of the invention, the functions of the data interface 1433 may be performed by the communication interface 1414.

Computer system 1400 includes a bus 1406 or other communication mechanism for communicating instructions, messages and data, collectively, information, and one or more processors 1407 coupled with the bus 1406 for processing information. Computer system 1400 also includes a main memory 1408, such as a random access memory (RAM) or other dynamic storage device, coupled to the bus 1406 for storing dynamic data and instructions to be executed by the processor(s) 1407. The main memory 1408 also may be used for storing temporary data, i.e., variables, or other intermediate information during execution of instructions by the processor(s) 1407.

The computer system 1400 may further include a read only memory (ROM) 1409 or other static storage device coupled to the bus 1406 for storing static data and instructions for the processor(s) 1407. A storage device 1410, such as a magnetic disk or optical disk, may also be provided and coupled to the bus 1406 for storing data and instructions for the processor(s) 1407.

A computer system 1400 may be coupled via the bus 1406 to a display device 1411, such as, but not limited to, a cathode ray tube (CRT), for displaying information to a user. An input device 1412, e.g., alphanumeric and other keys, is coupled to the bus 1406 for communicating information and command selections to the processor(s) 1407.

According to one embodiment of the invention, an individual computer system 1400 performs specific operations by their respective processor(s) 1407 executing one or more sequences of one or more instructions contained in the main memory 1408. Such instructions may be read into the main memory 1408 from another computer-usable medium, such as the ROM 1409 or the storage device 1410. Execution of the sequences of instructions contained in the main memory 1408 causes the processor(s) 1407 to perform the processes described herein. In alternative embodiments, hard-wired circuitry may be used in place of or in combination with software instructions to implement the invention. Thus, embodiments of the invention are not limited to any specific combination of hardware circuitry and/or software.

The term "computer-usable medium," as used herein, refers to any medium that provides information or is usable by the processor(s) 1407. Such a medium may take many forms, including, but not limited to, non-volatile and volatile media. Non-volatile media, i.e., media that can retain information in the absence of power, includes the ROM 1409, CD ROM, magnetic tape, and magnetic discs. Volatile media, i.e., media that can not retain information in the absence of power, includes the main memory 1408.

In the foregoing specification, the invention has been described with reference to specific embodiments thereof. It will, however, be evident that various modifications and changes may be made thereto without departing from the broader spirit and scope of the invention. For example, the reader is to understand that the specific ordering and combination of process actions shown in the process flow diagrams described herein is merely illustrative, and the invention can be performed using different or additional process actions, or a different combination or ordering of process actions. The specification and drawings are, accordingly, to be regarded in an illustrative rather than restrictive sense.

We claim:

1. A computer implemented method for performing verification of an integrated circuit, comprising:

using a computer system which comprises at least one processor and is programmed for:

reading a design description of the integrated circuit;
replacing a multi-strength device in the design description with a replacement logic which accurately models the multi-strength device and comprises one or more encoded output signals, wherein
at least one of the output signals is determined by comparing a first individual binary signal of a first input signal with a second individual binary signal of a second input signal, in which three or more individual binary signals are used to model multi-strength behavior of at least one of the first input signal and the second input signal, and
the one or more encoded output signals model and present multiple strength behavior of the multi-strength device as a plurality of Boolean logic values;
performing the verification by evaluating the design description together with the logic of the integrated circuit using a verification logic, wherein
the verification logic comprises a process that does not consider strength information of the integrated circuit; and
displaying the design description with the logic on a display apparatus or storing the design description with the logic in a computer readable storage medium or a storage device of the computer system.

2. The computer implemented method of claim 1, further comprising inserting strength resolution logic to the one or more encoded output signals.

3. The computer implemented method of claim 2 in which a signal of particular strength is selected for the multi-strength device.

4. The computer implemented method of claim 1 further comprising, inserting wire resolution logic for a resolution point, wherein the act of inserting the wire resolution logic for the resolution point comprises selecting one of two input signals which exhibit equal strength.

5. The computer implemented method of claim 4 in which signal strengths are resolved to a value.

6. The computer implemented method of claim 1 in which the multi-strength device corresponds to a switch device that is either partially on, partially off, completely on, or completely off.

7. The computer implemented method of claim 1 in which the verification of the circuit comprises equivalence checking.

8. The computer implemented method of claim 1 in which the one or more encoded output signals are used to drive another circuit stage.

9. The computer implemented method of claim 8 in which the another stage corresponds to a Boolean gate and at least one of the one or more encoded output signal passes through wire resolution logic.

10. The computer implemented method of claim 9 in which the wire resolution logic implements a wire-on or wire-off function.

11. The computer implemented method of claim 1 in which the act of performing the verification by evaluating the design description with the logic of the integrated circuit using the Boolean logic is performed without considering signal strength.

12. The computer implemented method of claim 1 in which strength values are encoded using individual signals which correspond to any strength values.

13. The computer implemented method of claim 12 in which the individual signals include a signal for weak strength and a signal for strong strength.

14. A system for performing verification of an integrated circuit, comprising:
a computer system which comprises at least one processor and is programmed for:
reading a design description of the integrated circuit;
replacing a multi-strength device in the design description with a replacement logic which accurately models the multi-strength device and comprises one or more encoded output signals, wherein
at least one of the output signals is determined by comparing a first individual binary signal of a first input signal with a second individual binary signal of a second input signal, in which three or more individual binary signals are used to model multi-strength behavior of at least one of the first input signal and the second input signal, and
the one or more encoded output signals model and present multiple strength behavior of the multi-strength device as a plurality of Boolean logic values; and
performing the verification by evaluating the design description together with the logic of the integrated circuit using a verification simulator, wherein
the verification simulator comprises a means for verification that does not consider strength information of the integrated circuit; and
displaying the design description with the logic on a display apparatus or storing the design description with the logic in a computer readable storage medium or a storage device of the computer system.

15. The system of claim 14, in which the computer system is further programmed for inserting strength resolution logic to the one or more encoded output signals.

16. The system of claim 15, in which a signal of particular strength is selected for the multi-strength device.

17. The system of claim 14, in which the computer system is further programmed for inserting wire resolution logic for a resolution point, wherein the act of inserting the wire resolution logic for the resolution point comprises selecting one of two input signals which exhibit equal strength.

18. The system of claims 14, in which strength values are encoded using individual signals which correspond to any strength values.

19. A computer program product comprising computer usable storage medium having executable coded which, when executed by at least one processor of a computer system, causes the computer system to perform a process for verification of an integrated circuit, the process comprising:
reading a design description of the integrated circuit;
replacing a multi-strength device in the design description with a replacement logic which accurately models the multi-strength device and comprises one or more encoded output signals, wherein
at least one of the output signals is determined by comparing a first individual binary signal of a first input signal with a second individual binary signal of a second input signal, in which three or more individual binary signals are used to model multi-strength behavior of at least one of the first input signal and the second input signal, and
the one or more encoded output signals model and present multiple strength behavior of the multi-strength device as a plurality of Boolean logic values;

performing the verification by evaluating the design description together with the logic of the integrated circuit using a verification simulator, wherein
the verification logic comprises a process that does not consider strength information of the integrated circuit; and
displaying the design description with the logic on a display apparatus or storing the design description with the logic in a computer readable storage medium or a storage device of the computer system.

20. The computer program product of claim 19, the process further comprising inserting strength resolution logic to the one or more encoded output signals.

21. The computer program product of claim 20, in which a signal of particular strength is selected for the multi-strength device.

22. The computer program product of claim 19, the process further comprising inserting wire resolution logic for a resolution point, wherein the act of inserting the wire resolution logic for the resolution point comprises selecting one of two input signals which exhibit equal strength.

23. The computer program product of claim 19, in which strength values are encoded using individual signals which correspond to any strength values.

* * * * *